United States Patent
Gupta et al.

(10) Patent No.: US 7,991,013 B2
(45) Date of Patent: Aug. 2, 2011

(54) DIGITAL RECEIVER FOR RADIO-FREQUENCY SIGNALS

(75) Inventors: Deepnarayan Gupta, Hawthorne, NY (US); Oleg A. Mukhanov, Putnam Valley, NY (US)

(73) Assignee: Hypres, Inc., Elmsford, NY (US)

( * ) Notice: Subject to any disclaimer, the term of this patent is extended or adjusted under 35 U.S.C. 154(b) by 885 days.

(21) Appl. No.: 11/966,889

(22) Filed: Dec. 28, 2007

(65) Prior Publication Data

US 2008/0107213 A1 May 8, 2008

Related U.S. Application Data

(63) Continuation-in-part of application No. 11/424,121, filed on Jun. 14, 2006, now Pat. No. 7,362,125.

(51) Int. Cl.
*H04L 27/06* (2006.01)
*H04B 1/06* (2006.01)
*G06F 1/04* (2006.01)
*H03K 19/00* (2006.01)
*H03K 19/195* (2006.01)

(52) U.S. Cl. ........ 370/481; 370/281; 370/296; 370/480; 370/484; 375/219; 375/316; 375/317; 455/130; 455/133; 455/137; 455/550.1; 455/553.1

(58) Field of Classification Search ............ 370/281, 370/295, 313, 480, 481, 484; 375/136, 219, 375/316, 359, 377; 455/3.02, 73, 553.1, 455/130, 132, 133, 137, 550.1

See application file for complete search history.

(56) References Cited

U.S. PATENT DOCUMENTS

| | | | |
|---|---|---|---|
| 5,973,643 A * | 10/1999 | Hawkes et al. | 342/457 |
| 6,865,639 B2 | 3/2005 | Herr | |
| 6,917,537 B2 | 7/2005 | Bunyk | |
| 6,960,929 B2 | 11/2005 | Bedard | |
| 7,362,125 B2 * | 4/2008 | Gupta et al. | 326/7 |
| 2002/0003843 A1 * | 1/2002 | Martone | 375/262 |

OTHER PUBLICATIONS

Hashimoto, et al., "Implementation of a 4×4 Switch with Passive Interconnects", IEEE Trans. Appl. Supercon., vol. 15, No. 2, Jun. 2005, pp. 356-359.

Brock, et al., "Superconductor Digital Development for Software Radio", IEEE Commun, Mag., pp. 174-179, Feb. 2001.

Likharev, et al., "RSFQ Logic/Memory Family: A new Josephson junction technology for sub-THz digital systems", IEEE Trans. Appl. Supercond., vol. 1, pp. 3-28, 1991.

* cited by examiner

*Primary Examiner* — Chi H Pham
*Assistant Examiner* — Ahmed Elallam
(74) *Attorney, Agent, or Firm* — Steven M. Hoffberg; Ostrolenk Faber LLP

(57) ABSTRACT

A system and method for receiving radio frequency signals, comprising a plurality of analog signal couplers, for communicating a representation of a radio frequency signal; a respective analog to digital converter for each of said couplers, each having an output presenting a digital representation of the representation and an associated clock; a non-blocking switch matrix, receiving the plurality of outputs and associated clocks, and producing a plurality of regenerated outputs and associated regenerated clocks under selective control of a switch matrix signal; and a plurality of digital radio frequency signal processors, adapted to receive at least one regenerated output from the non-blocking switch matrix and associated regenerated clock.

48 Claims, 11 Drawing Sheets

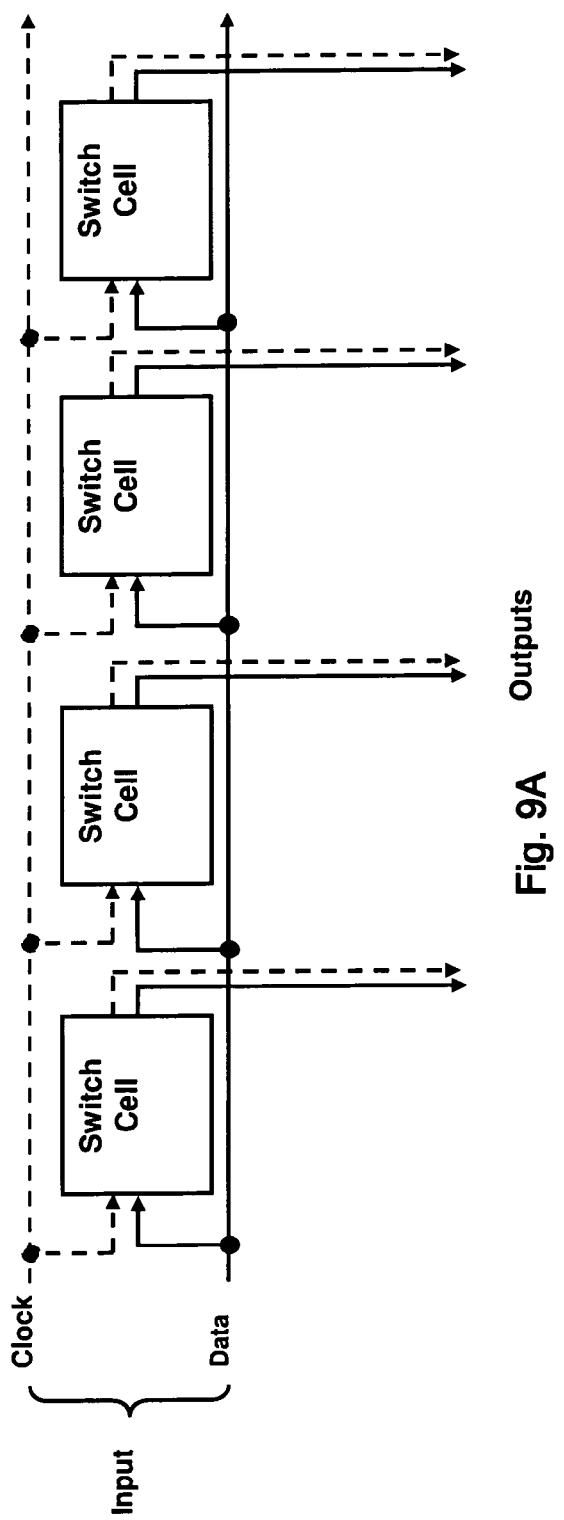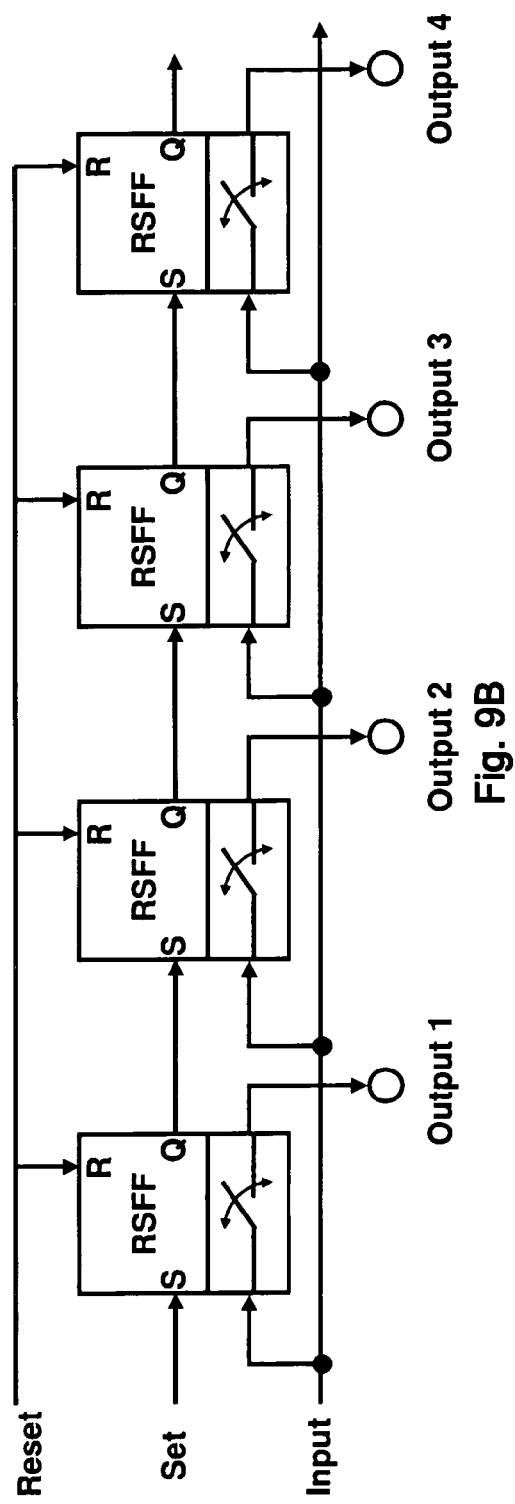
Fig. 9A
Fig. 9B

DIGITAL RECEIVER FOR RADIO-FREQUENCY SIGNALS

CROSS REFERENCE TO RELATED APPLICATIONS

This application is related to and claims priority to the following applications:
(1) U.S. application Ser. No. 11/243,019, filed Oct. 5, 2005, now U.S. Pat. No. 7,680,474, issued Mar. 16, 2010, by inventors Alexander Kirichenko, Deepnarayan Gupta, and Saad Sarwana entitled Superconducting Digital Mixer; (2) U.S. application Ser. No. 11/243,022, filed Oct. 5, 2005, now abandoned, from which U.S. application Ser. No. 11/943,798, filed Nov. 21, 2007, which issued as U.S. Pat. No. 7,554,369 issued Jun. 30, 2009, claimed benefit of priority, by inventor Alexander Kirichenko entitled A Digital Programmable Frequency Divider; (3) U.S. application Ser. No. 11/243,020, filed Oct. 5, 2005, now U.S. Pat. No. 7,750,664 issued Jul. 6, 2010, by inventor Alexander Kirichenko entitled A Digital Programmable Phase Generator; (4) U.S. application Ser. No. 11/360,749, filed Feb. 23, 2006, now U.S. Pat. No. 7,443,719, issued Oct. 28, 2008, by inventors Alexander Kirichenko, Timur Filippov, and Deepnarayan Gupta entitled Superconducting Circuit for High-Speed Lookup Table; (5) U.S. application Ser. No. 11/424,121, filed Jun. 14, 2006, now U.S. Pat. No. 7,362,125, issued Apr. 22, 2008, by inventors Deepnarayan Gupta and Alexander Kirichenko entitled Digital Routing Switch Matrix for Digitized Radio-Frequency Signals. Each of these applications is hereby incorporated by reference in its entirety.

BACKGROUND OF THE INVENTION

1. Field of the Invention

This invention relates to the field of switching circuits and, more particularly, for switching circuits for advanced digital radio receivers and transmitters.

2. Description of the Prior Art

A simple classic radio receiver consists of a single antenna coupled to a downconverter that extracts a single "baseband" channel. In a modern receiver, the baseband signal is digitized with an analog-to-digital converter (ADC) and further processed in the digital domain. A classic transmitter contains essentially the same components working in the reverse direction; a transceiver contains both a transmitter and a receiver packaged together.

A multi-band, multi-channel RF communications system (see FIG. 1a) can include multiple antennas, and can extract multiple baseband channels or groups of channels simultaneously. This requires a switch matrix, which permits distribution of various signals between each antenna (corresponding to each band) and one or more appropriate radio receiver channels. If the system is to be flexible and reconfigurable, it should be possible to redirect input signals to selected output channels.

The signal at the antenna is an analog waveform, even if it may be encoding a digital signal. In a conventional receiver system of the prior art, as illustrated in FIG. 1a, both the switch matrix and the channelizing receivers are analog components, and similarly for the transmitter. However, these band-specific precision analog components are often expensive and limited in their flexibility and reconfigurability. Furthermore, these analog switching systems have severe deficiencies in terms of losses, isolation, crosstalk, and ability to multicast.

For these reasons, the communications industry would like to move toward an approach known as "software-defined radio" (SDR) or "software radio", where all data processing is carried out in the digital domain, except right at the antenna itself. This requires ultrafast data converters, with sampling rates of tens of GHz and excellent linearity. ADCs with the requisite properties have recently been demonstrated, based on superconductor electronics using Josephson junctions, with circuit designs based on rapid-single-flux-quantum logic (RSFQ). It is natural that this data conversion be carried out right at the antenna, as illustrated in FIG. 1b. But in this case, the switching must also be carried out directly on the digital-RF signals. Furthermore, the precision and linearity of these signals can be maintained in the distribution network only if the sampling clock is distributed along with the data bits. This requires a new type of digital-RF switch matrix, which has not been reported before, and which is the subject of the present invention.

Furthermore, the digital-RF transceiver architecture allows natural partitioning between band-specific (analog) and band-independent (digital) components. Analog components, such as antennas and amplifiers are optimized for performance within a particular frequency band. Even data converters between analog and digital formats, ADCs and DACs, work best with designs that target specific frequency bands. Furthermore, an ADC or DAC optimized for a particular frequency band will typically have a particular sampling frequency (clock frequency $f_{clock}$) that is preferred for best performance. For example, a radio-frequency bandpass ADC designed for a center frequency f) may exhibit the greatest dynamic range for a sampling frequency that is four times the center frequency ($f_{clock}=4\times f$)). On the contrary, digital signal processing units, operating on numbers, are independent of the signal characteristics. This partitioning enables the true software radio paradigm by allowing full software programmability of the RF distribution network. Superconductor electronics are fast enough to digitize at multi-GHz RF and perform subsequent processing completely in the digital domain.

Switch matrices based on superconducting electronic circuits have been recently reported by several inventors. For example, see (1) U.S. Pat. No. 6,960,929, issued Nov. 1, 2005 by inventor Fernand D. Bedard, entitled Superconductive Crossbar Switch, (2) U.S. Pat. No. 6,917,537, issued Jul. 12, 2005 by inventor Paul I. Bunyk entitled RSFQ Batcher-Banyan Switching Network, (3) U.S. Pat. No. 6,865,639, issued Mar. 8, 2005 by inventor Quentin P. Herr entitled Scalable Self-Routing Superconductor Switch, and (4) Hashimoto et al., Implementation of a 4×4 Switch With Passive Interconnects, IEEE Trans. Appl. Supercon., vol 15, no. 2, June 2005, pp. 356-359.

However, none of these patents was designed for an application in RF communications, and none of these include switches which route the clock signal together with the data signal, which are two of several reasons this invention distinguishes over the prior art. See also the article by D. K. Brock, O. A. Mukhanov, and J. Rosa, "Superconductor Digital Development for Software Radio," IEEE Commun. Mag., pp. 174-179, February 2001, and K. K. Likharev and V. K. Semenov, "RSFQ Logic/Memory Family: A new Josephson junction technology for sub-THz digital systems", IEEE Trans. Appl. Supercond., vol. 1, pp. 3-28, 1991.

PROBLEMS OF THE PRIOR ART

The prior art switches have been expensive and limited in their flexibility and ability to reconfigure. In addition, they have severe deficiencies in terms of losses, isolation, cross talk and ability to multicast.

It is natural and desirable that data conversion be carried out right at the antenna, but, in such a case, the switching must also be carried out directly on the digital-RF signals. Further, the precision and linearity of these signals can be maintained in the distribution network only if the sampling clock is distributed along with the data bits. This requires and new type of digital-RF switch matrix which is the subject of the present invention.

SUMMARY AND OBJECTS OF THE INVENTION

A multi-carrier, multi-channel RF communication system requires a switch matrix to route various signals between a set of antennas and a set of radio transceivers. This can be carried out most efficiently in the digital domain, but requires the use of ultrafast circuits that can accurately process multi-GHz RF signals.

One aspect of the invention is directed to a switch matrix which is suitable for routing various signals between a set of antennas and a set of radio transceivers. The transceivers can be multi-carrier, multi-channel RF communication devices. The routing is carried out in the digital domain and uses ultra fast superconductive circuits that can accurately process multi-gigahertz RF signals. For best performance the basic switching cell must carry both the data bits and the sampling clock, where the sampling clock may be at different frequencies for signals from different RF bands distributed within the same switch matrix.

Preferred exemplary embodiments of the invention are implemented using ultra fast RSFQ superconducting logic elements.

It is therefore an object of the invention to provide a radio frequency receiver, comprising: a plurality of analog signal couplers, for communicating a representation of a radio frequency signal; a respective analog to digital converter for each of the couplers, each having an output presenting a digital representation of the representation and an associated clock; a non-blocking switch matrix, receiving the plurality of outputs and associated clocks, and producing a plurality of regenerated outputs and associated regenerated clocks under selective control of a switch matrix signal; and a plurality of digital radio frequency signal processors, adapted to receive at least one regenerated output from the non-blocking switch matrix and associated regenerated clock.

The associated clock for at least two of the respective analog to digital converters may be independent of each other and/or at different frequencies. The associated clock for a respective analog to digital converter may operate above a Nyquist rate for a radio frequency carrier of the radio frequency signal. Thus, the analog to digital converter may operate at frequencies in excess of 350 mega-samples per second, and, for example, at frequencies of 1, 5, 10, 20, 40 or even 100 giga-samples per second, or higher. Typically, the preferred oversampling range is at least 4 times the highest substantial-power frequency component in the band to be subsequently analyzed. Because there is no particular requirement for down-conversion or frequency translation of the signals, the band may be a "baseband" signal, that is, one in which energy components extend to DC or near 0 Hertz. Practically, a received radio frequency signal will not have such low frequencies, but in some cases may include signals in the kilohertz or higher range. Each analog signal coupler may therefore be adapted to couple a radio frequency signal within a band, the band having an upper range limit, the associated clock for the respective analog to digital converter operating above a Nyquist rate for the upper range limit.

As is known, if the frequency of a signal component having significant power exceeds the Nyquist rate, which is considered double the highest frequency, then there will be aliasing of the signal onto lower frequency components. While this is generally undesirable, in some cases, it is acceptable, especially where the signal has a frequency above the capabilities of the process, it has modulated information that can be extracted from the aliased signal, and when aliased, it does not interfere with reception of a signal of interest. Each analog signal coupler may therefore be adapted to couple a radio frequency signal within a band, the radio frequency signal comprising an information signal, the associated clock for the respective analog to digital converter operating above a minimum rate required to capture and digitally represent the information signal from the radio frequency signal.

At least two of the plurality of analog signal couplers may be adapted to couple analog signals having information signals modulated on different radio frequency bands, the non-blocking switch matrix routing and regenerating a respective digital representation of the information signals to respective different digital radio frequency signal processors which are adapted to demodulate the respective information signal.

The digital representation may be, for example, an oversampled discrete representation of the respective radio frequency signal.

At least one of the analog to digital converter, non-blocking switch matrix, and digital radio frequency processor may comprise a plurality of superconducting elements operating at cryogenic temperatures. For example, these may include superconducting Niobium-based Josephson Junctions, configured into RFSQ local devices.

The non-blocking switch matrix may be adapted to simultaneously multicast the regenerated output and associated regenerated clock from a single output and associated clock for processing by at least two of the plurality of digital radio frequency signal processors. Thus, the switch matrix may support a one-to-many fan-out.

At least one of the respective analog to digital converters may generate a parallel multiple binary bit digital representation of the representation of the radio frequency signal, the parallel multiple binary bit digital representation and associated clock being routed by the non-blocking switch matrix to at least one digital radio frequency signal processor. The multiple binary bit analog-to-digital converter may be, for example, a single bit delta-sigma architecture converter, which is processed to produce a multi-bit output, or an intrinsically multibit converter. Of course, a single bit converter and signal distribution architecture may also be employed.

The regenerated output and associated regenerated clock may be routed together to maintain proper synchronization at a radio frequency signal processor.

A delay compensation network may be provided, adapted to maintain proper synchronization among a plurality of data paths, each data path communicating a regenerated output and a respective regenerated clock.

The non-blocking switch matrix may be adapted to simultaneously distribute a plurality of regenerated outputs with respective associated regenerated clocks, the plurality of associated regenerated clocks having respectively different clock frequencies. The non-blocking switch matrix may comprise a Banyan network.

The non-blocking switch matrix may comprise a plurality of switch elements, each controlled by at least one digital control line, to provide a digitally controllable input to output relationship, wherein a respective digital control line is applied to the switch elements in parallel. Likewise, a respective digital control line may be applied to a first element, and the first element generates a signal which serves as an input to a second element, the first and second elements controlling respective switches, providing a series configuration or a hybrid series/parallel configuration, in which a respective digital control line is applied to a plurality of first elements, which generate a state of a respective digital control line for control of at least one second element, the first and second elements controlling respective switches.

The radio frequency signals communicated through a respective plurality of radio frequency couplers may be received through separate antennas serving separate bands. A plurality of radio frequency signals may be received through different antennas and communicated through a respective plurality of radio frequency couplers, and selectively concurrently routed through the non-blocking switch matrix to a plurality of digital channelizing receivers.

According to one embodiment, at least one digital radio frequency signal processor comprises a channelizing receiver implementing at least one stage of digital down-conversion of the digital representation from a frequency of the radio frequency signal to a lower frequency, while substantially retaining information modulated in a channel of the radio frequency signal.

At least one digital radio frequency signal processor may comprise a channelizing receiver implementing at least one stage of digital down-conversion of the digital representation from a frequency of the radio frequency signal to a lower frequency, while substantially retaining in-phase and quadrature-phase information modulated in a channel of the radio frequency signal.

It is another object of the invention to provide a system for receiving signals, comprising a plurality of signal receivers, adapted to generate digital data directly from a received radio frequency signal substantially without frequency translation, based on a digital data clock signal defined independently of the received signal and having a sufficiently high clock rate to preserve information modulated in the received radio frequency signal, each having a respective output; and a switch matrix adapted to receive and selectively direct the outputs of the plurality of signal receivers, and respective associated digital data clock signals, to a plurality of digital signal processors, each accepting the generated digital data at the high clock rate.

A quantity of digital signal processors provided may be greater or fewer than a quantity of signal receivers, and wherein the switch matrix provides a multicasting capability which permits an output of a respective signal receiver to be selectively provided to a plurality of digital signal processors.

A plurality of channels of the switch matrix may have independently tunable analog delay.

It is a further object of the invention to provide a radio frequency receiver method, comprising converting an analog representation of each of a plurality of radio frequency signals to a respective plurality of digital signals with a respective analog to digital converter, each respective analog to digital converter having an output presenting a digital representation of the analog representation and an associated clock; receiving the plurality of outputs and associated clocks with a non-blocking switch matrix, and producing a plurality of regenerated outputs and associated regenerated clocks under selective control of a switch matrix signal; and receiving at least one regenerated output from the non-blocking switch matrix and associated regenerated clock with a plurality of digital radio frequency signal processors.

The associated clock for at least two of the respective analog to digital converters may be independent of each other. The associated clock for a respective analog to digital converter may operate above a Nyquist rate for a radio frequency carrier of the radio frequency signal. Each radio frequency signal may be situated within a band, the band having an upper range limit, the associated clock for the respective analog to digital converter operating above a Nyquist rate for the upper range limit. Likewise, each radio frequency signal may be situated within a band, the radio frequency signal may comprise an information signal, with the associated clock for the respective analog to digital converter operating above a minimum rate required to capture and digitally represent the information signal from the radio frequency signal. The digital representation may be an oversampled discrete representation of the respective radio frequency signal.

At least two of the radio frequency signals may comprise information signals modulated on different radio frequency bands, the non-blocking switch matrix routing and regenerating a respective digital representation of the information signals to respective different digital radio frequency signal processors which are adapted to demodulate the respective information signal.

At least one of the analog to digital converter, the non-blocking switch matrix, and the digital radio frequency processor may comprise a plurality of superconducting elements, operated at cryogenic temperatures. The non-blocking switch matrix may comprise a Banyan network.

The method may further comprise the step of simultaneously multicasting a single output and associated clock as the regenerated output and associated regenerated clock from the non-blocking switch matrix for processing by at least two of the plurality of digital radio frequency signal processors.

At least one of the respective analog to digital converters may generate a parallel multiple binary bit digital representation of the representation of the radio frequency signal, the parallel multiple binary bit digital representation and associated clock being routed by the non-blocking switch matrix to at least one digital radio frequency signal processor.

The method may further comprise the step of routing the regenerated output and associated regenerated clock together to maintain proper synchronization at a radio frequency signal processor. Data traveling over at least one data path may be delayed with a delay compensation network to maintain proper synchronization among a plurality of data paths, each data path communicating a regenerated output and a respective regenerated clock.

A plurality of regenerated outputs with respective associated regenerated clocks may be simultaneously distributed from the non-blocking switch matrix, the plurality of associated regenerated clocks having respectively different clock frequencies.

The non-blocking switch matrix may comprise a plurality of switch elements each controlled by at least one digital control line, to provide a digitally controllable input to output relationship, applying a signal over a respective digital control line to the switch elements in parallel, and/or applying a first signal through respective digital control line to a first element, and generating a second signal with the first element which serves as an input to a second element, the first and second elements controlling respective switches. The non-blocking switch matrix may comprise a plurality of switches each controlled by at least one digital control line, to provide a digitally controllable input to output relationship between a respective analog signal coupler and a respective digital radio frequency signal processor, applying a signal over a respective digital control line to a plurality of first elements, which generates a state of a respective digital control line for control of at least one second element, the first and second elements controlling respective switches.

The radio frequency signals may be communicated through a respective plurality of radio frequency couplers, the respective radio frequency couplers receiving the radio frequency signals through separate antennas, serving separate bands corresponding to each coupler.

A plurality of radio frequency signals may be received through different antennas and communicating the received radio frequency signals through a respective plurality of radio frequency couplers, and selectively concurrently routing the digital representation of the analog representation and an associated clock through the non-blocking switch matrix, the plurality of digital radio frequency signal processors comprising a plurality of digital channelizing receivers.

At least one digital radio frequency signal processor may comprise a channelizing receiver implementing at least one stage of digital down-conversion of the digital representation from a frequency of the radio frequency signal to a lower frequency, while substantially retaining information modulated in a channel of the radio frequency signal. For example, in-phase and quadrature-phase information modulated in a channel of the radio frequency signal may be substantially retained.

It is a still further object to provide a method for receiving signals, comprising generating digital data directly from a received radio frequency signal substantially without frequency translation, based on a digital data clock signal defined independently of the received signal and having a sufficiently high clock rate to preserve information modulated in the received radio frequency signal, each having a respective output; and receiving and selectively directing the outputs of the plurality of signal receivers and respective associated digital data clock signals with a non-blocking switch matrix, to a plurality of digital signal processors, each accepting the generated digital data at the high clock rate. A quantity of digital signal processors provided may be fewer than a quantity of signal receivers, and wherein the switch matrix provides a multicasting capability which permits an output of a respective signal receiver to be selectively provided to a plurality of digital signal processors. A plurality of channels of the switch matrix may have independently tunable analog delay.

BRIEF DESCRIPTION OF THE DRAWINGS

FIGS. 9A and 9B show implementations of a multicasting switch using RSFQ cells, respectively with and without clock accompanying a data line.

DETAILED DESCRIPTION OF THE INVENTION

I. Basic Switching Cells

RSFQ logic, first developed by Likharev, Semenov, and Mukhanov, is built around Josephson junctions (JJs), with lossless propagation of single-flux-quantum (SFQ) voltage pulses, each corresponding to an integrated pulse of 2 mV-ps. Two different types of RSFQ switch cells are described, both of which are well known in the literature: the DC switch and the NDRO switch. In either case, the general principle of operation is the same. A JJ is biased such that an SFQ pulse will cause it to temporarily exceed its critical current and then return to its previous state, thus emitting another SFQ pulse. The switching time, which depends on the critical current density (Jc) of the JJ, is about 2 ps for the Jc=4.5 kA/cm$^2$. This ultrafast switching allows a very high rate (40 Gbps and higher) of SFQ digital signals. Whether or not a switch responds to an input SFQ pulse depends on its designed control conditions (DC bias, control current, or other concurrent digital events). For example, the state of the switch—whether it will pass or block a digital input—may be controlled by the state of a coupled flip-flop, where control information could be stored.

Figure 1A:
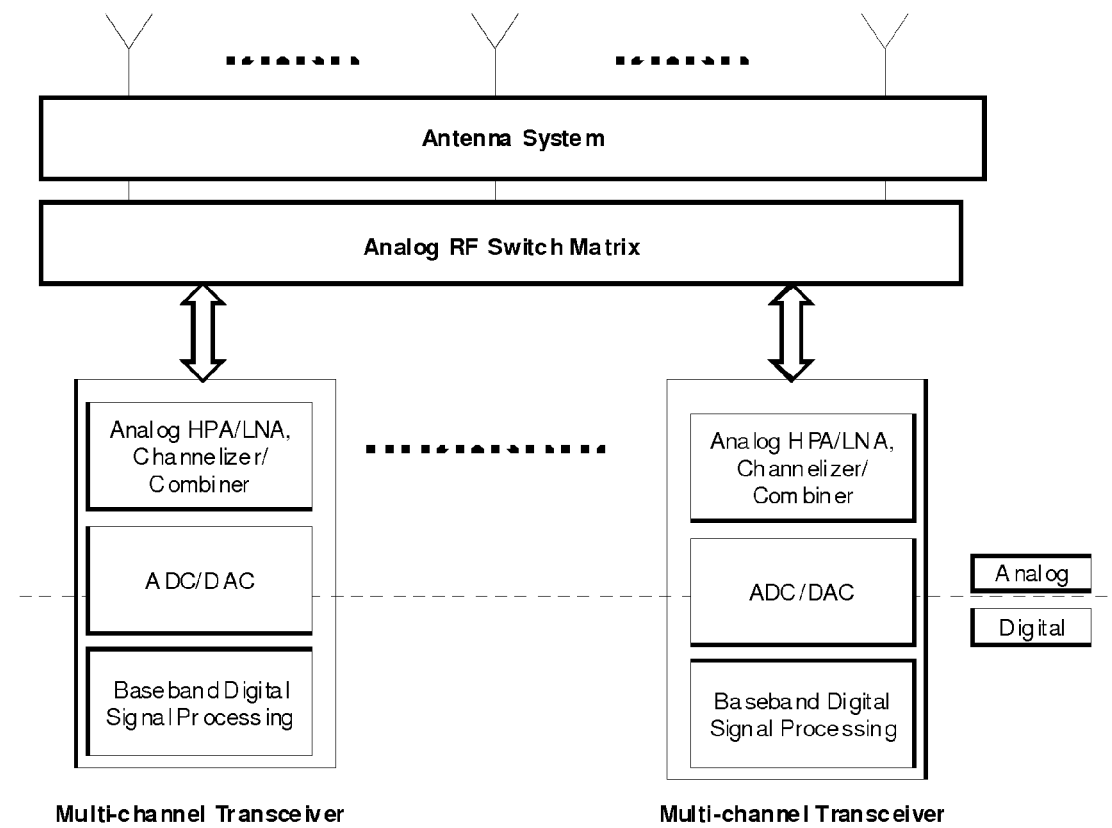
FIG. 1A is a block diagram of a multi-band, multi-channel RF transceiver system incorporating an analog switch matrix as known in the prior art.
Figure 1B:
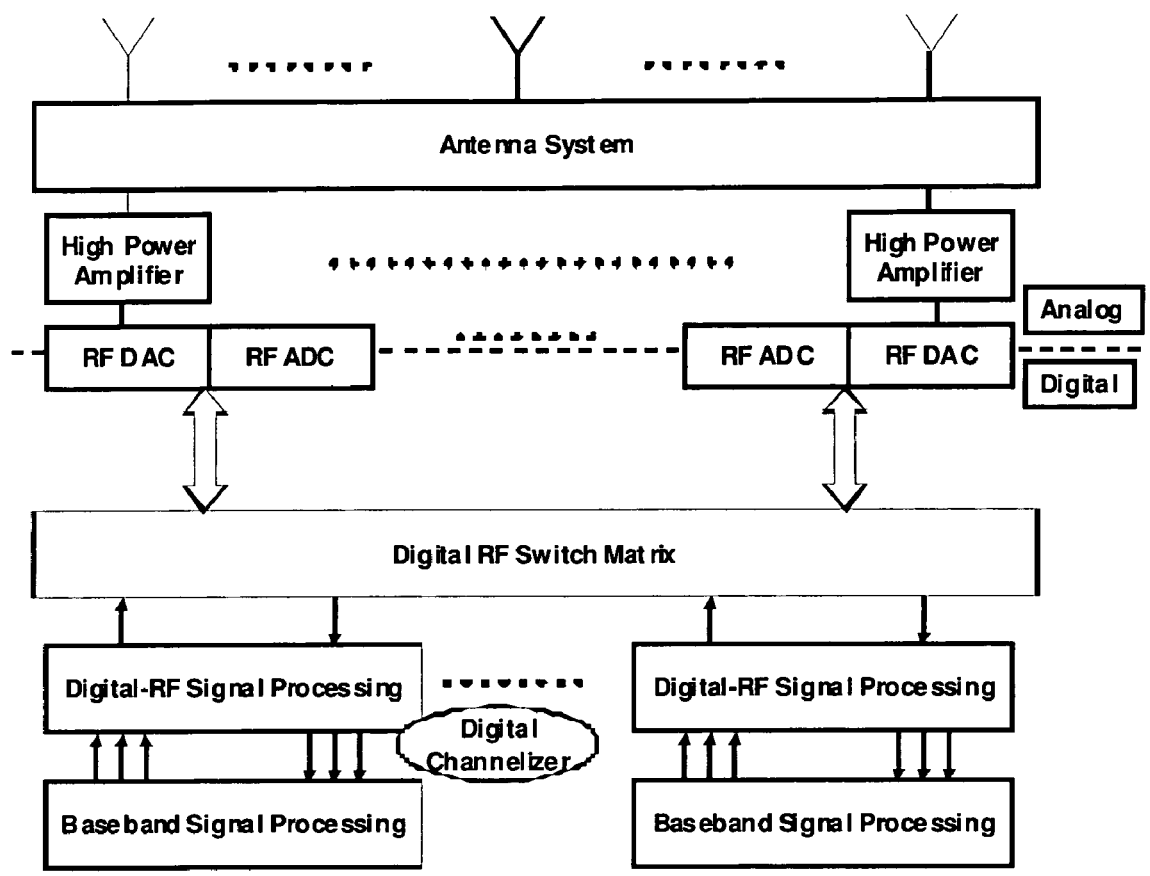
FIG. 1B is a block diagram of a multi-band, multi-channel RF transceiver system incorporating a new digital switch matrix for use with digital RF architectures in accordance with one aspect of the invention.
Figure 2:
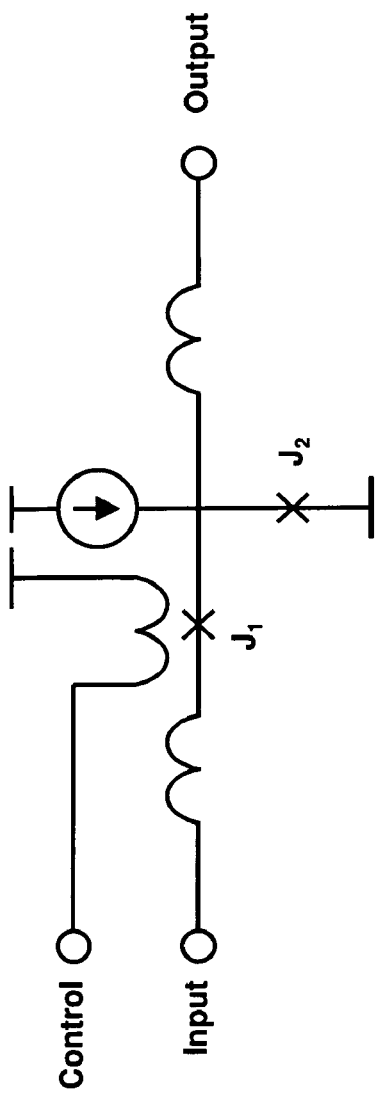
FIG. 2 shows a basic digital switch using Josephson junctions.

FIG. 2 shows a schematic diagram of a simple DC-switch with only 2 JJs, which is controlled by applying DC current to the control line.

Figure 3B:
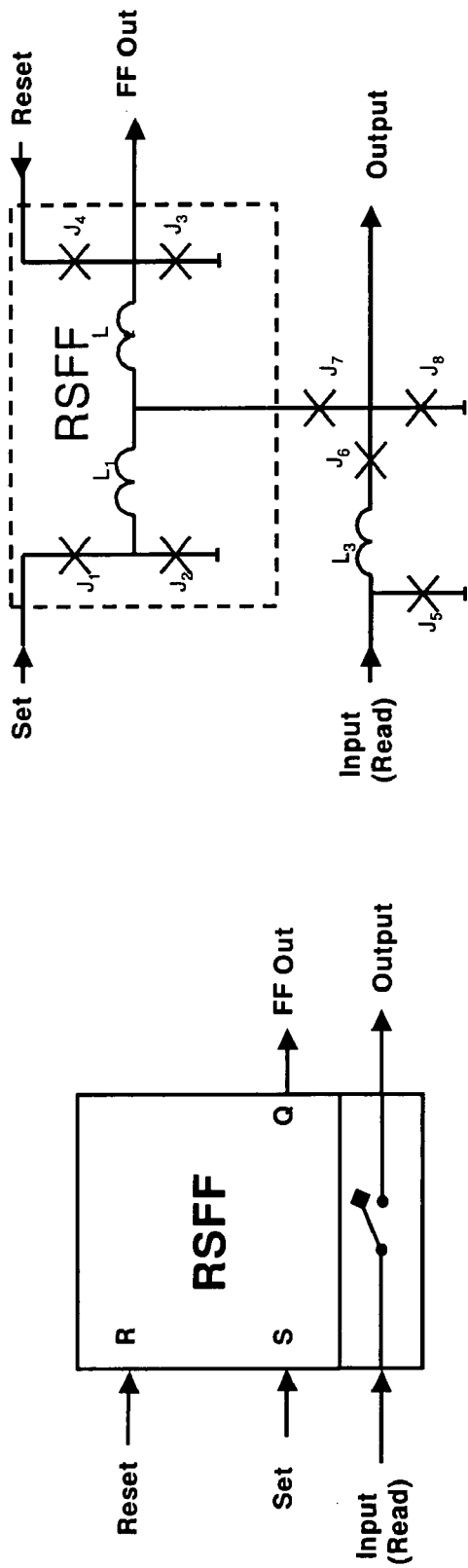
FIG. 3B is a schematic diagram of the digital switch based on a non-destructive readout (NDRO) cell.
Figure 3A:
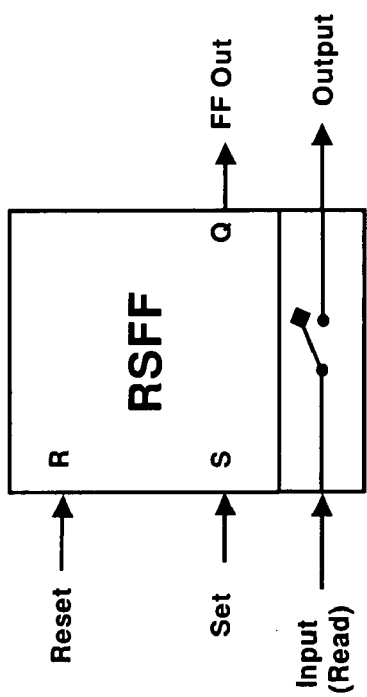
FIG. 3A is a block diagram of a digital switch based on a non-destructive readout (NDRO) cell.

FIGS. 3A and 3B show another digital switch element, called a non-destructive readout (NDRO) switch, where the control information is stored in a reset-set flip-flop (RSFF). (The NDRO switch with 8 JJs is more complex for a single switch, but is more easily scalable to large switch matrices.) An SFQ pulse applied to the Set input sets the RSFF to the '1' state. While it is in the '1' state, any pulse applied to the input will be read out as an SFQ pulse at the output synchronized to the clock input. This corresponds to the 'ON' (closed) state of the switch.

If a pulse is applied to the Reset input, the RSFF is reset to the '0' state. While it is in the '0' state, any pulse applied to the input will escape through J6 and no SFQ pulse will be produced at the output. This corresponds to the 'OFF' (open) state of the switch. One advantage of this type of switch is that only one external control line is required for each cell to write the desired switch states for the entire matrix. Thus the control for the entire matrix can be stored as a serial digital word. This is achieved by simply connecting the RSFFs of different switch cells as a shift register by applying the FF Out to the Set input of the next RSFF.

One needs to route both data and clock from each input source through the switch to desired output ports, for fully asynchronous operation. Of course, this can be accomplished by two switch cells which are manually set (reset) together. However a more elegant solution is part of one aspect of the invention by routing the clock signal through an NDRO switch and controlling propagation of the data stream through an RSFF (see FIG. 4 where the clock line is shown as a dashed line), thus reducing the JJ count necessary.

Figure 4:
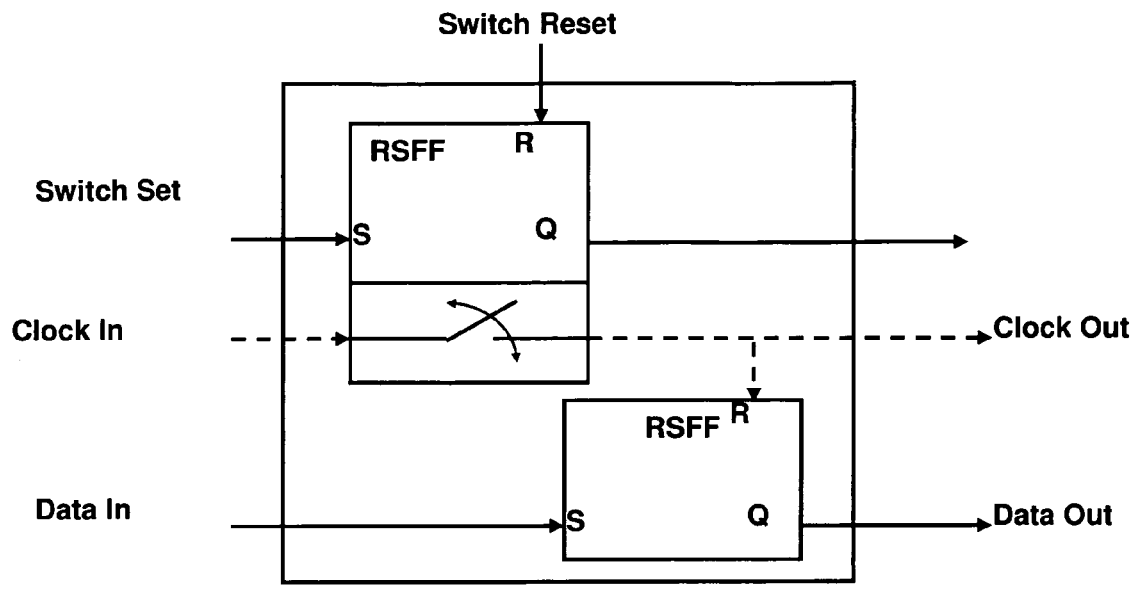
FIG. 4 is a novel switch cell for routing clock and data together.

FIG. 4 can be extended to accommodate a n-bit parallel data stream by replicating instance of the Data RSFF for each bit stream of the n-bit parallel data stream, with each RSFF being reset by the clock output signal.

II. Routing Switch Architecture

Consider a switch architecture where each input is routed only to a single output.

Figure 5:
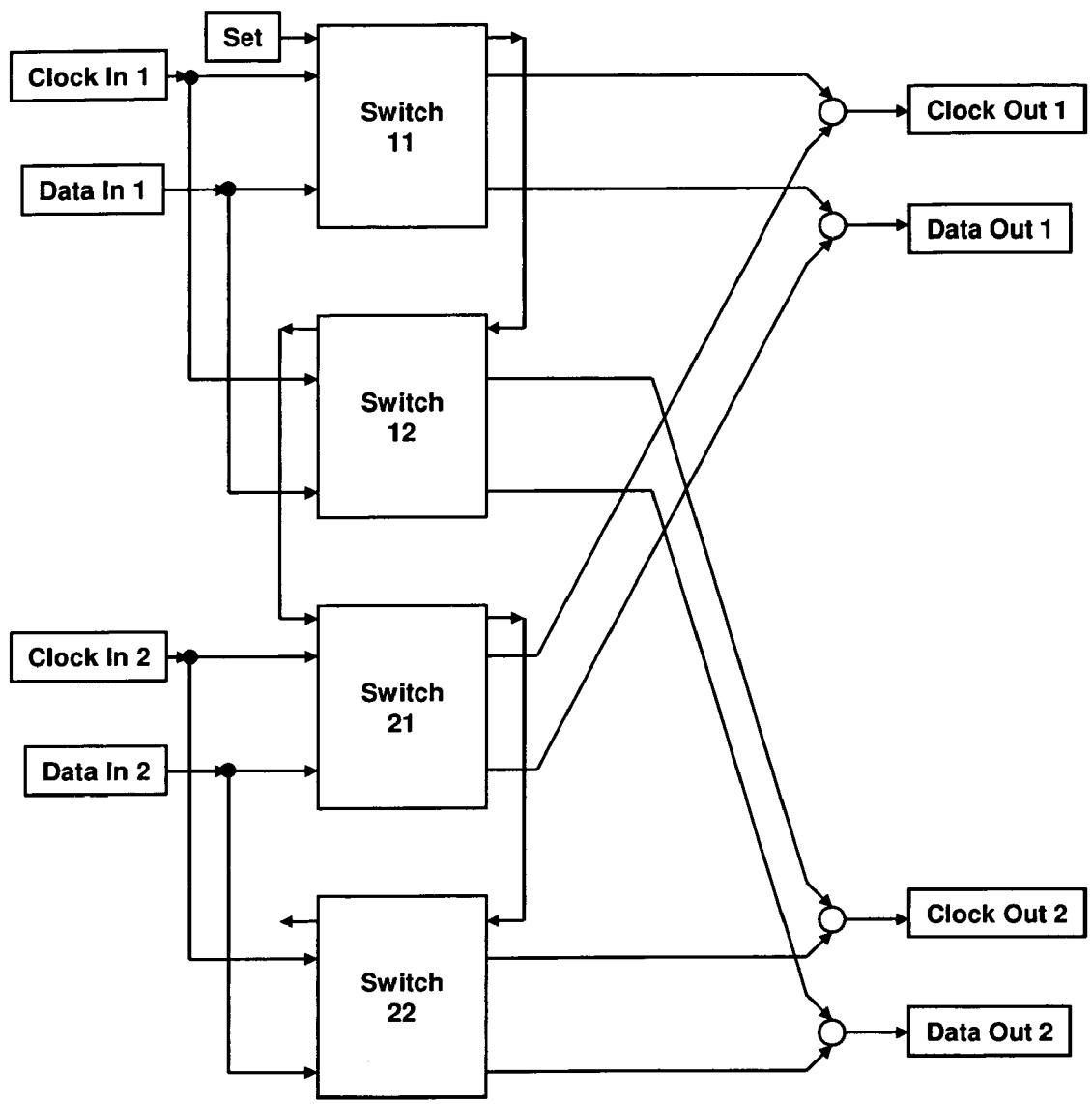
FIG. 5 is a block diagram of a 2×2 building-block for a 1:1 router matrix.

(This constraint will be relaxed later.) To see how to scale up from a single switch, consider first a 2×2 building block (see FIG. 5). This is done with 4 switch cells. The data and clock signals from the first input are applied to Switch 11 and Switch 12 respectively, and the data and clock signals from the second input are applied to Switch 21 and Switch 22 respectively. The data and clock outputs from Switch 11 and Switch 21 are merged (combined) at the first output port, and the data and clock outputs from Switch 12 and Switch 22 are merged (combined) at the second output port. We have shown both clock and data paths, as well as the control (set) line, explicitly to illustrate the complexity of the design. We did not show the reset line, which will add to the routing complexity, but could be laid out similarly to the set lines in a way that should be obvious to one skilled in the art. Throughout the layout, maintaining accurate relative timing between paired clock and data signals is essential for correct operation.

Figure 6:
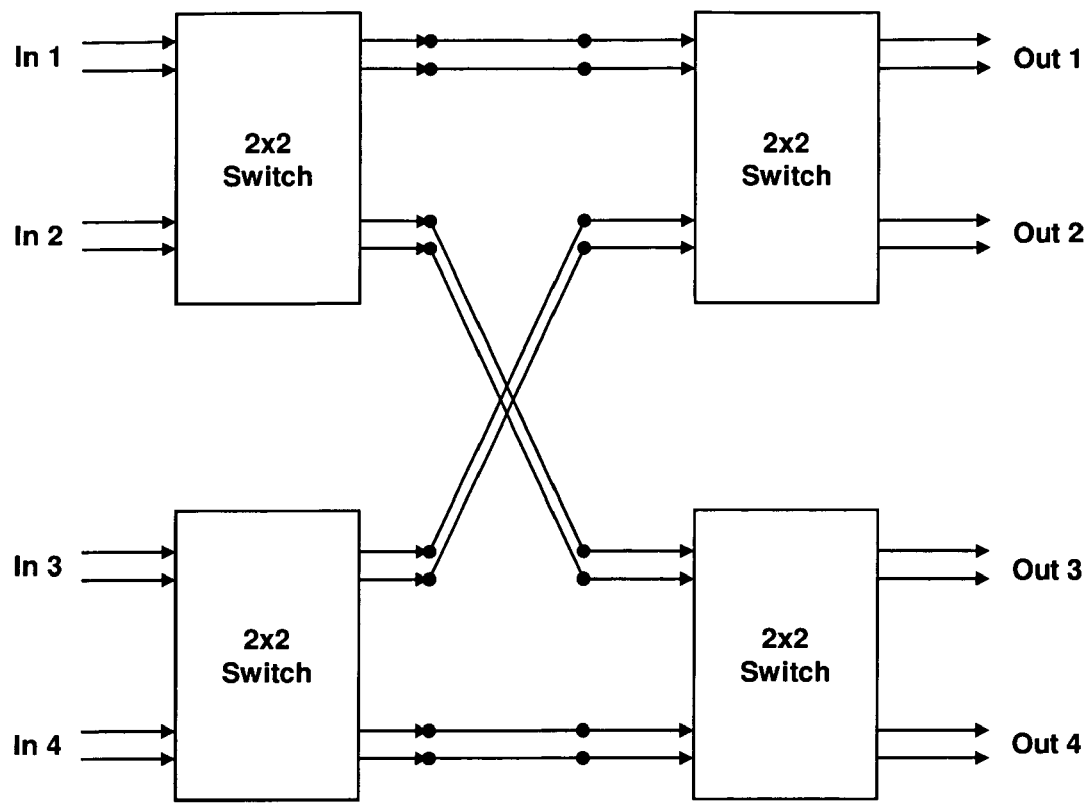
FIG. 6 is a block diagram of a 4×4 switch matrix consisting of four 2×2 building-blocks in a Banyan network.

Once a 2×2 switching network is complete, standard network approaches can be used to generate larger networks. For example, FIG. 6 shows the design of a 4×4 switch using the well-known, scalable Banyan network, with the double lines indicating routing of both data and clock signals together.

III. Architecture of Multicasting, Cross-Point Switch Matrix

Figure 8:
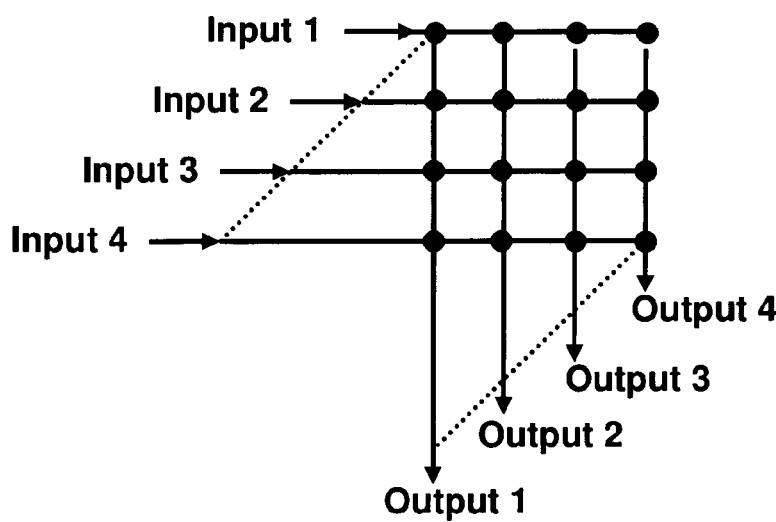
FIG. 8 shows an optional delay compensation network for a multicasting switch matrix of the type shown in FIG. 7.
Figure 7:
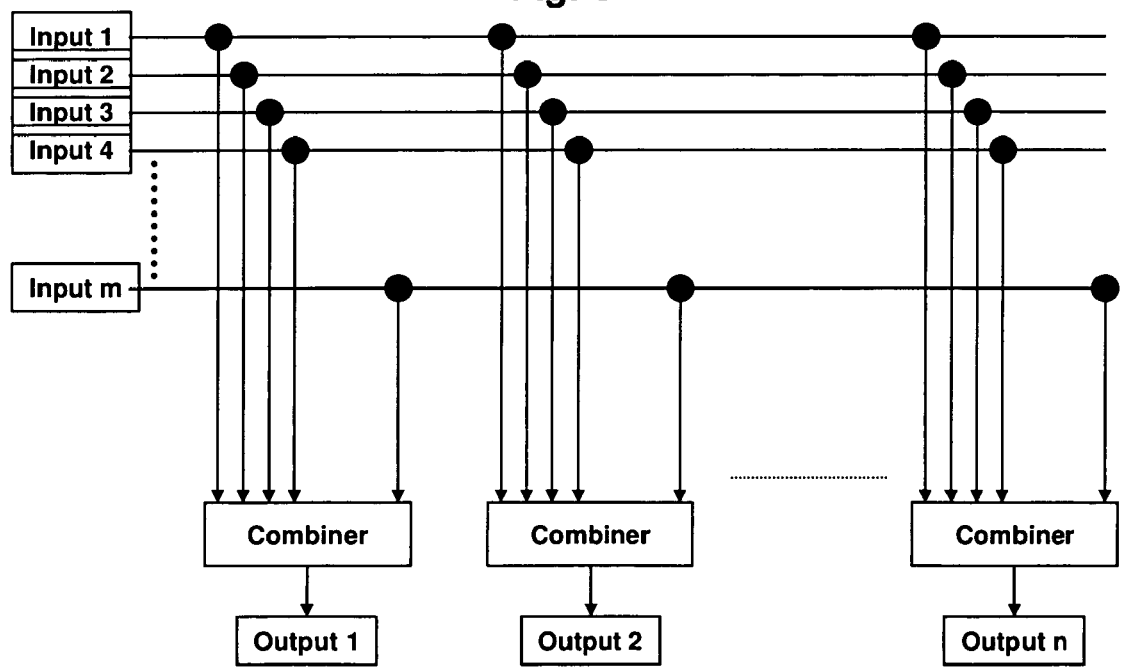
FIG. 7 shows a block diagram of a multicasting switch matrix in accordance with one aspect of the invention.

For some applications, it is necessary to copy one input to multiple outputs, or vice versa. The relevant switch architecture here is an M×N cross-point switch matrix that connects M inputs to N outputs (FIG. 7). Here each input propagates horizontally through a set of switch cells. If a switch is turned on, a copy of the input data stream is routed down the corresponding column towards an output port; there is no degradation of signal quality since digital copying is lossless. Any number of switches may be turned on in each row to produce copies of the input at multiple output ports. There is a potential problem of latency in this structure, since the signal propagation paths from an input port to different output ports is different. For most communications applications, such small differences in propagation delays (a nanosecond or less) do not matter. Delay compensation networks (shown as triangles in FIG. 8) can be added for applications, such as a network switch for multiprocessor supercomputers, that are sensitive to delay mismatches. Delay compensation can be achieved using passive lines of matched physical lengths or active transmission structures with matching delay times (such as tunable Josephson transmission lines).

We can use the same DC and NDRO switches (FIGS. 2, 3A and 3B or the switch cell of FIG. 4) to build this multicasting switch matrix depending on whether the clock line accompanies the data line. The building block of this matrix is a row (FIGS. 9A and 9B).

The multicasting switch matrix architecture in FIG. 7 is composed of M×N switches as in FIGS. 3A and 3B. Each switch has a set and reset line that permits the routing to be dynamically modified. For many implementations, as suggested in FIG. 9B, the "set" lines may be connected in series, and the entire M×N array addressed by a single digital word. Given the very fast clock speed, the entire array can be reconfigured in a short time. For very large arrays, partial parallel addressing (of separate rows, for example) may be used to speed up the reprogramming rate. In this way, one may direct any input to any and all of the outputs, in a way that is rapidly reconfigurable.

IV. Integration of Switch Matrix into Transceiver System

Figure 10:
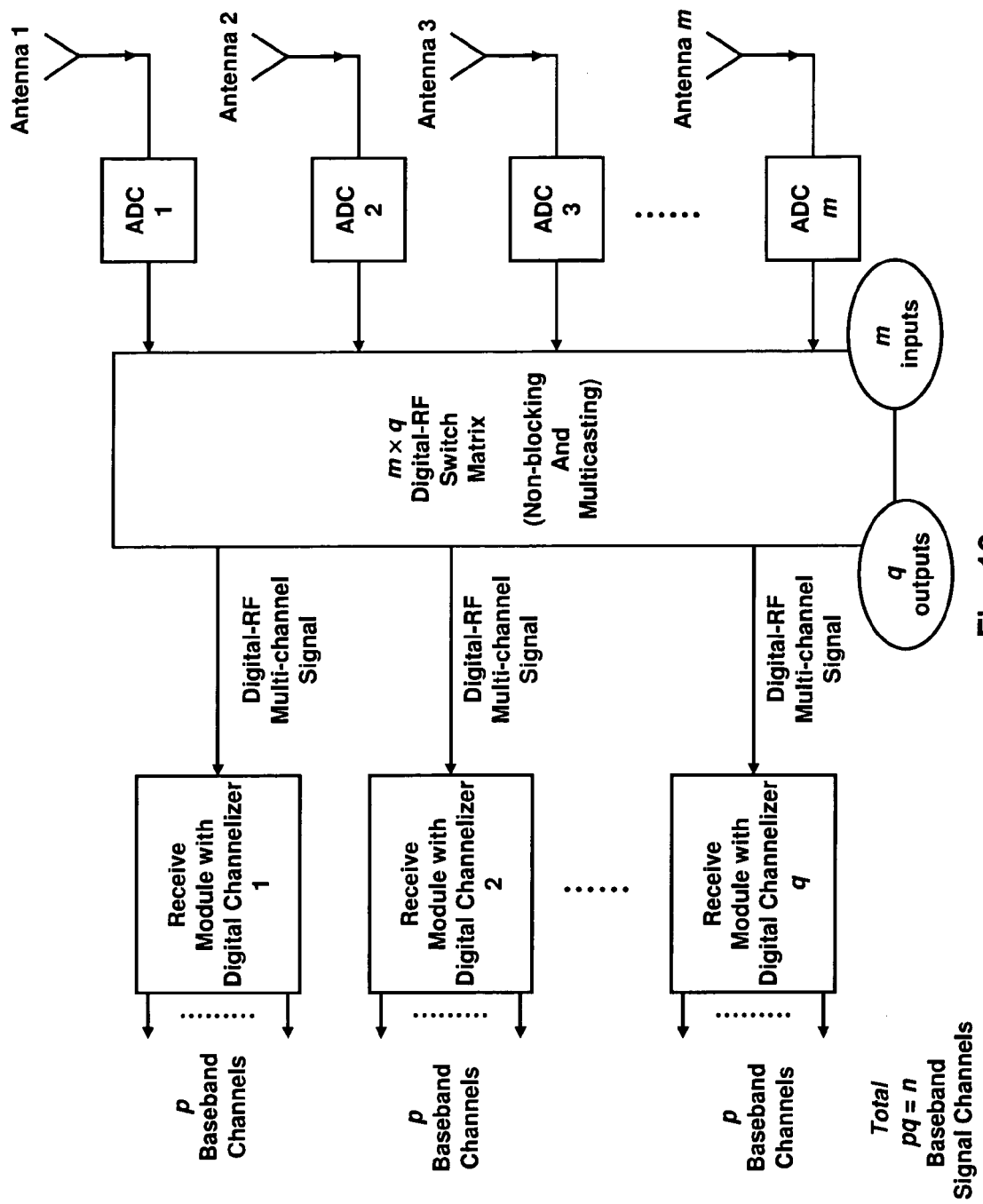
FIG. 10 is a block diagram of a digital-RF switch matrix for receiver systems showing size of the switching array.

To exemplify the advantages of digital routing of RF signals, let us examine the receive side in greater detail (FIG. 10). The analog RF input signals are digitized directly at RF using an ADC behind each antenna. Once the RF signals are in the digital domain, multiple copies can be generated without compromising signal power and quality. Therefore, the digital-RF signal can be simultaneously applied to a bank of digital channelizing units, each operating independently to extract a subband from a wide input band. For a multi-band system, digitized data streams from multiple ADC front-ends can be distributed to a bank of channelizers through a digital non-blocking, multicasting switch matrix. This architecture is scalable to an arbitrary number of channelizers (or more general digital processors) and banded antenna-ADC pairs. Furthermore, the digital switch matrix can be programmed in real time to dynamically reconfigure the communication system: changing band-to-channel allocation, cross-banding, etc.

In general, signal processing involves multiple steps, including multiple levels of channelization. For simplicity, here we have considered only the first level channelization function: extraction of a sub-band through mixing and filtering. This step requires digital-RF processing at clock speeds of 40 Gbps and beyond, and therefore, may be accomplished using superconductor electronics.

One special requirement for the switch matrix is its ability to support multiple input data rates. The ADCs may not share the same clock frequency. For example, the choice of clock frequency may depend on the center frequency of the band for convenient digital in-phase and quadrature (I & Q) mixing, which requires the clock to be 4 times higher or multiples thereof. An asynchronous or better-said multi-synchronous switch, routing both the clock and digitized data together, is essential to address this requirement. This ability to distribute digital signals with several different clock frequencies simultaneously within the same general-purpose switch matrix is a unique feature of one aspect of the invention.

Figure 11:
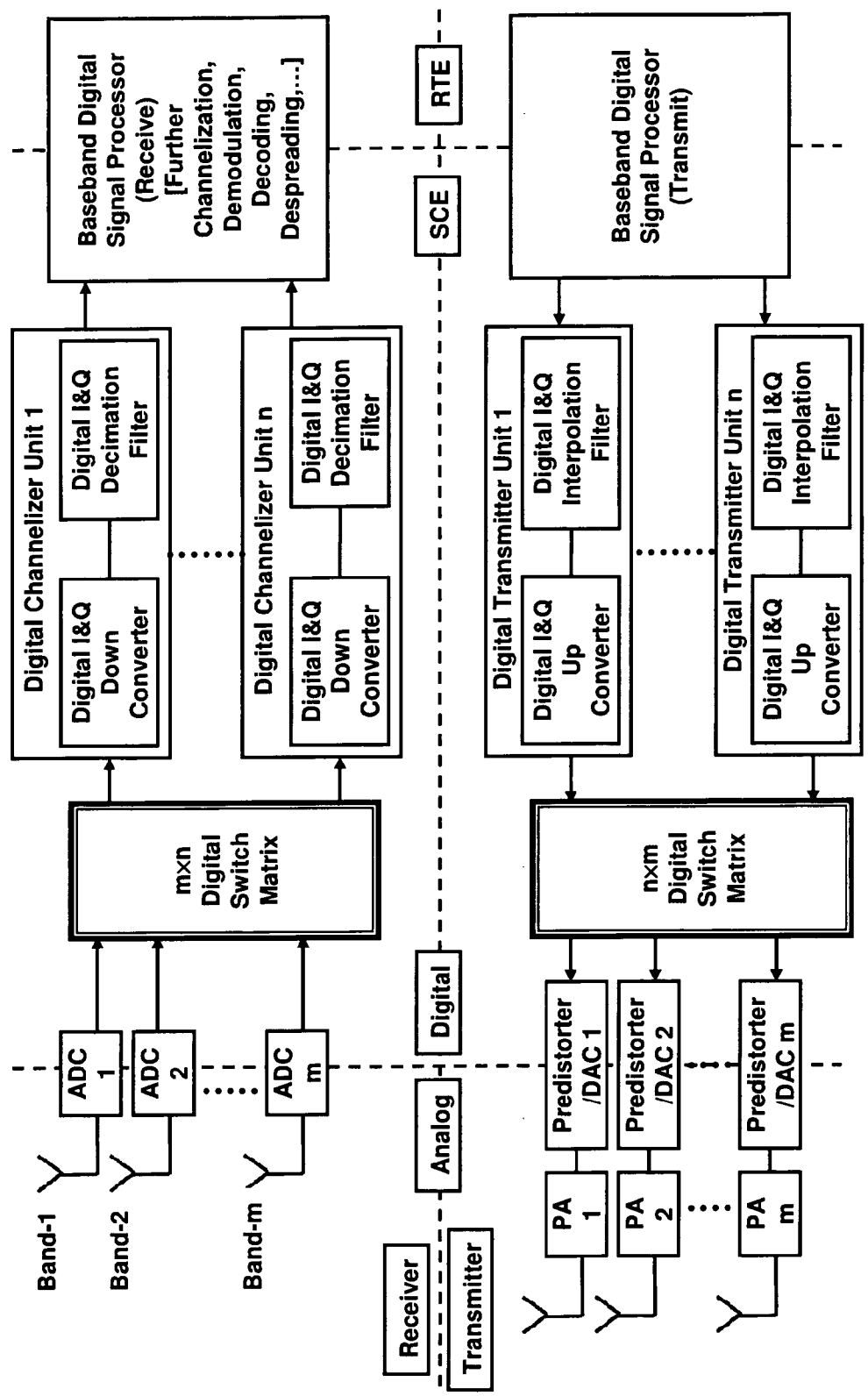
FIG. 11 shows a block diagram of a digital switch matrix included in both receiver and transmitter of a complete digital-RF transceiver system.

A general block diagram of a complete direct digital-RF communication system is shown in FIG. 11. A multi-band RF communication system consists of an antenna subsystem to capture electromagnetic energy in different RF bands and a transceiver subsystem to transmit and receive information from each RF band through a variety of signal processing steps (e.g., up/down-conversion, filtering, modulation/demodulation, coding/decoding, etc.). The goal is to dynamically assign the available signal processing resources to the input bands to meet the communication needs. This requires dynamic RF distribution and routing. The top half of FIG. 11 shows the receive side, where direct digitization of RF signals by analog-to-digital converters (ADCs) is followed by programmable digital routing to a bank of digital processing units. The bottom half shows the reciprocal transmit side. Here, multiple transmit signals are digitally synthesized and connected to digital-to-analog converters (DACs), coupled to digital-RF predistorters that linearize the RF transfer function of high power amplifiers (HPAs) directly.

A similar switch matrix may also be incorporated within a digital-RF transmitter system. In one embodiment of the invention, as indicated in the Multicasting Switch Matrix in FIG. 7, it may be desirable to direct more than one digital-RF input to be combined in the same output. Functionally, the multiple inputs may be added in a Combiner circuit, where this must be carried out in the Digital Domain in the digital-RF signals. Let us assume here that the clock frequencies of these signals to be added are the same. That is generally the case for signals designed for transmission using the same output antenna, which are within the same output band. Then the Combiner circuit can be implemented as simply a fast clocked Binary Adder, as has already been demonstrated in RSFQ technology. The outputs of the Binary Adder circuit may be passed along to a multi-bit Digital-to-Analog converter (DAC), the output of which can then be passed to an RF Power Amplifier, and then to a Transmission Antenna.

Figure 12:
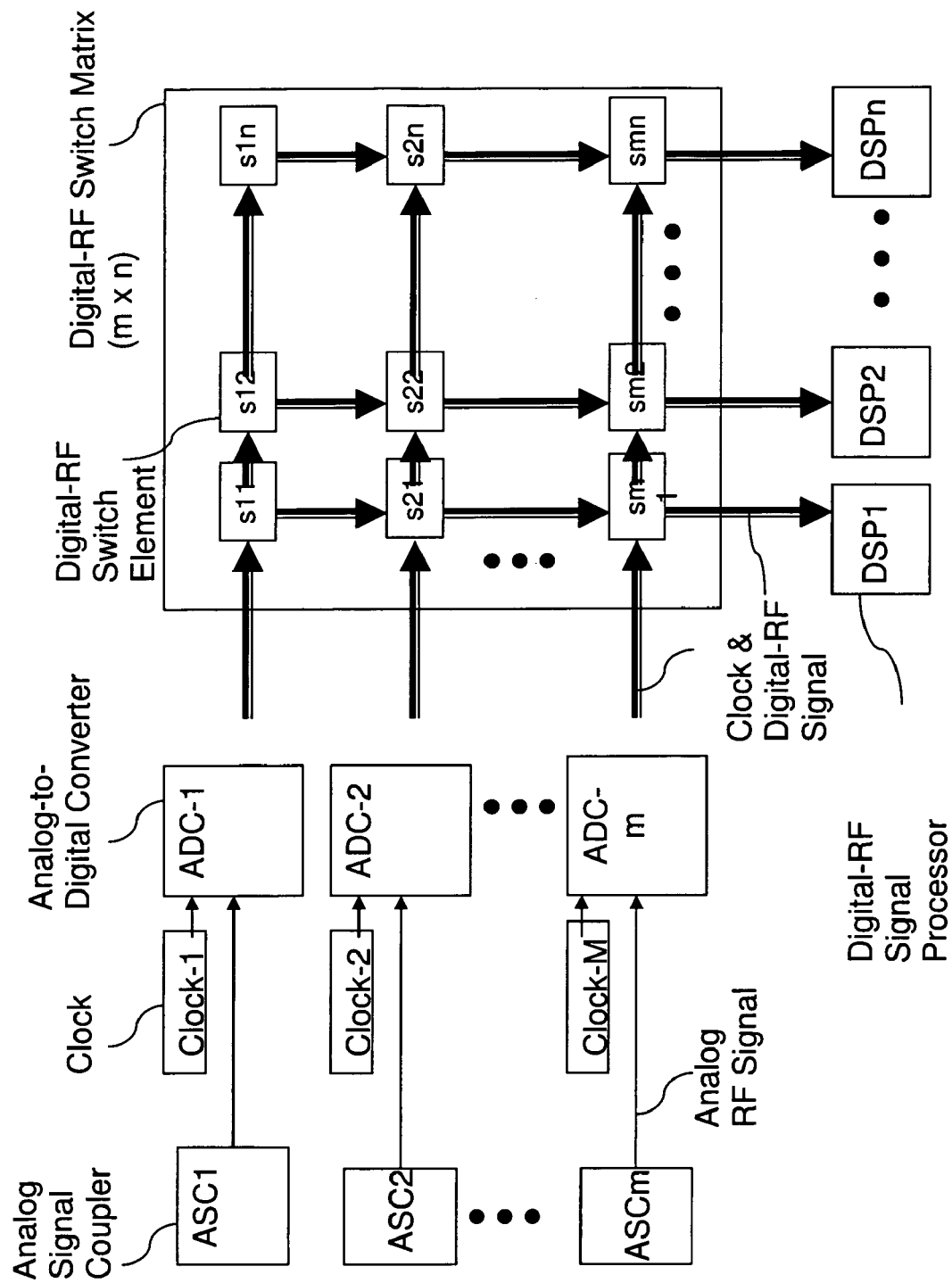
FIG. 12 shows a schematic diagram of a receiver.

FIG. 12 shows a receiver system in which a plurality (m) of analog signal couplers $ASC_1 \ldots ASC_m$ each provide an analog radio frequency signal to a respective analog-to-digital receiver ADC-1 ... ADC-m, each of which provides an input to a switch matrix, having switch elements $s_{11} \ldots s_{mn}$. A plurality (n) of digital signal processors $DSP_1 \ldots DSP_n$ receive outputs from the switch matrix, and process the received digitized signals. The switch matrix is non-blocking, and, not shown in the figure, multicasting, so the number of digital signal processors may be the same or different than the number of analog-to-digital converters.

Figure 13:
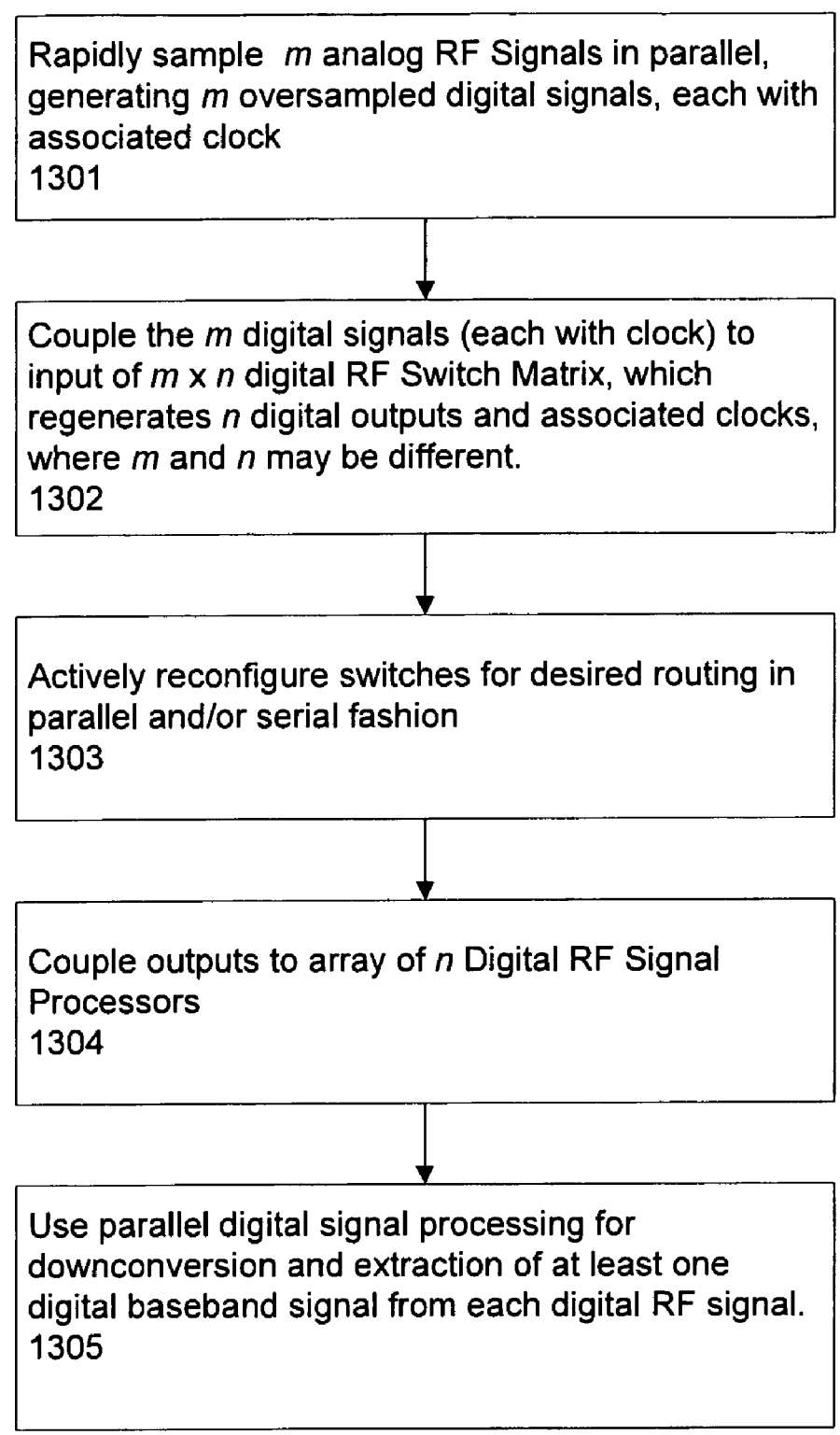
FIG. 13 shows a flowchart of a receiving method.

FIG. 13 shows a flowchart of a method according to the present invention. Initially, m analog RF Signals are rapidly sampled in parallel 1301, generating m oversampled digital signals, each with an associated clock. The m digital signals (each with clock) are coupled to respective inputs of an m×n digital RF Switch Matrix 1302, which regenerates n digital outputs and associated clocks, where m and n may be different. Switches for a desired routing may be actively reconfigured, in parallel and/or serial fashion 1303. Outputs of the switch matrix are then coupled to an array of n Digital RF Signal Processors 1304. Parallel digital signal processing is used for downconversion and extraction of at least one digital baseband signal from each digital RF signal 1305.

While various embodiments of the present invention have been illustrated herein in detail, it should be apparent that modifications and adaptations to those embodiments may occur to those skilled in the art without departing from the scope of the present invention as set forth in the following claims.

What is claimed is:

1. A radio frequency receiver, comprising:
a plurality of analog signal couplers, for communicating a representation of a radio frequency signal;
a respective analog to digital converter for each of said couplers, each having an output presenting a digital representation of the representation and an associated clock;
a non-blocking switch matrix, receiving the plurality of outputs and associated clocks, and producing a plurality of regenerated outputs and associated regenerated clocks under selective control of a switch matrix signal; and
a plurality of digital radio frequency signal processors, configured to receive at least one regenerated output from the non-blocking switch matrix and associated regenerated clock.

2. The receiver according to claim 1, wherein the associated clock for at least two of the respective analog to digital converters is independent.

3. The receiver according to claim 1, wherein the associated clock for a respective analog to digital converter operates above a Nyquist rate for a radio frequency carrier of the radio frequency signal.

4. The receiver according to claim 1, wherein each analog signal coupler is configured to couple a radio frequency signal within a band, the band having an upper range limit, the associated clock for the respective analog to digital converter operating above a Nyquist rate for the upper range limit.

5. The receiver according to claim 1, wherein each analog signal coupler is configured to couple a radio frequency signal within a band, the radio frequency signal comprising an information signal, the associated clock for the respective analog to digital converter operating above a minimum rate required to capture and digitally represent the information signal from the radio frequency signal.

6. The receiver according to claim 1, wherein at least two of said plurality of analog signal couplers are configured to couple analog signals having information signals modulated on different radio frequency bands, said non-blocking switch matrix routing and regenerating a respective digital representation of the information signals to respective different digital radio frequency signal processors which are configured to demodulate the respective information signal.

7. The receiver according to claim 1, wherein the digital representation is an oversampled discrete representation of the respective radio frequency signal.

8. The receiver according to claim 1, wherein at least one of said analog to digital converter, said non-blocking switch matrix, and said digital radio frequency processor comprises a plurality of superconducting elements operating at cryogenic temperatures.

9. The receiver according to claim 1, wherein said non-blocking switch matrix is configured to simultaneously multicast the regenerated output and associated regenerated clock from a single output and associated clock for processing by at least two of the plurality of digital radio frequency signal processors.

10. The receiver according to claim 1, wherein at least one of said respective analog to digital converters generates a parallel multiple binary bit digital representation of the representation of the radio frequency signal, said parallel multiple binary bit digital representation and associated clock being routed by said non-blocking switch matrix to at least one digital radio frequency signal processor.

11. The receiver according to claim 1, wherein the regenerated output and associated regenerated clock are routed together to maintain proper synchronization at a radio frequency signal processor.

12. The receiver according to claim 1, further comprising a delay compensation network configured to maintain proper synchronization among a plurality of data paths, each data path communicating a regenerated output and a respective regenerated clock.

13. The receiver according to claim 1, wherein said non-blocking switch matrix is configured to simultaneously distribute a plurality of regenerated outputs with respective associated regenerated clocks, the plurality of associated regenerated clocks having respectively different clock frequencies.

14. The receiver according to claim 1, wherein said non-blocking switch matrix comprises a Banyan network.

15. The receiver according to claim 1, wherein the non-blocking switch matrix comprises a plurality of switch elements each controlled by at least one digital control line, to provide a digitally controllable input to output relationship, wherein a respective digital control line is applied to said switch elements in parallel.

16. The receiver according to claim 1, wherein the non-blocking switch matrix comprises a plurality of switches each controlled by at least one digital control line, to provide a digitally controllable input to output relationship, wherein a respective digital control line is applied to a first element, and the first element generates a signal which serves as an input to a second element, the first and second elements controlling respective switches.

17. The receiver according to claim 1, wherein the non-blocking switch matrix comprises a plurality of switches each controlled by at least one digital control line, to provide a digitally controllable input to output relationship between a respective analog signal coupler and a respective digital radio frequency signal processor, wherein a respective digital control line is applied to a plurality of first elements, which generate a state of a respective digital control line for control of at least one second element, the first and second elements controlling respective switches.

18. The receiver according to claim 1, wherein the radio frequency signals communicated through a respective plurality of radio frequency couplers are received through separate antennas serving separate bands.

19. The receiver according to claim 1, wherein a plurality of radio frequency signals are received through different antennas and communicated through a respective plurality of radio frequency couplers, and selectively concurrently routed through said non-blocking switch matrix to a plurality of digital channelizing receivers.

20. The receiver according to claim 1, wherein at least one digital radio frequency signal processor comprises a channelizing receiver implementing at least one stage of digital down-conversion of the digital representation from a frequency of the radio frequency signal to a lower frequency, while substantially retaining information modulated in a channel of the radio frequency signal.

21. The receiver according to claim 1, wherein at least one digital radio frequency signal processor comprises an channelizing receiver implementing at least one stage of digital down-conversion of the digital representation from a frequency of the radio frequency signal to a lower frequency, while substantially retaining in-phase and quadrature-phase information modulated in a channel of the radio frequency signal.

22. A system for receiving signals, comprising:
a plurality of signal receivers, configured to generate digital data directly from a received radio frequency signal without frequency translation, based on a digital data clock signal defined independently of the received signal and having a sufficiently high clock rate to preserve information modulated in the received radio frequency signal, each having a respective output; and
a switch matrix configured to receive and selectively direct the outputs of the plurality of signal receivers, and respective associated digital data clock signals, to a plurality of digital signal processors, each accepting the generated digital data at the high clock rate.

23. The system according to claim 22, wherein a quantity of digital signal processor is fewer than a quantity of signal receivers, and wherein the switch matrix provides a multicasting capability which permits an output of a respective signal receiver to be selectively provided to a plurality of digital signal processors.

24. The system according to claim 22, wherein a plurality of channels of the switch matrix have independently tunable analog delay.

25. A radio frequency receiver method, comprising:
converting an analog representation of each of a plurality of radio frequency signals to a respective plurality of digital signals with a respective analog to digital converter, each respective analog to digital converter having an output presenting a digital representation of the analog representation and an associated clock;
receiving the plurality of outputs and associated clocks with a non-blocking switch matrix, and producing a plurality of regenerated outputs and associated regenerated clocks under selective control of a switch matrix signal; and
receiving at least one regenerated output from the non-blocking switch matrix and associated regenerated clock with a plurality of digital radio frequency signal processors.

26. The method according to claim 25, wherein the associated clock for at least two of the respective analog to digital converters is independent.

27. The method according to claim 25, wherein the associated clock for a respective analog to digital converter operates above a Nyquist rate for a radio frequency carrier of the radio frequency signal.

28. The method according to claim 25, wherein each radio frequency signal is situated within a band, the band having an upper range limit, the associated clock for the respective analog to digital converter operating above a Nyquist rate for the upper range limit.

29. The method according to claim 25, wherein each radio frequency signal is situated within a band, the radio frequency signal comprising an information signal, the associated clock for the respective analog to digital converter operating above a minimum rate required to capture and digitally represent the information signal from the radio frequency signal.

30. The method according to claim 25, wherein at least two of the radio frequency signals comprise information signals modulated on different radio frequency bands, said non-blocking switch matrix routing and regenerating a respective digital representation of the information signals to respective different digital radio frequency signal processors which are configured to demodulate the respective information signal.

31. The method according to claim 25, wherein the digital representation is an oversampled discrete representation of the respective radio frequency signal.

32. The method according to claim 25, wherein at least one of said analog to digital converter, said non-blocking switch matrix, and said digital radio frequency processor comprises a plurality of superconducting elements, further comprising the step of operating said at least one of said analog to digital converter, said non-blocking switch matrix, and said digital radio frequency processor at cryogenic temperatures.

33. The method according to claim 25, further comprising the step of simultaneously multicasting a single output and associated clock as the regenerated output and associated regenerated clock from said non-blocking switch matrix for processing by at least two of the plurality of digital radio frequency signal processors.

34. The method according to claim 25, wherein at least one of said respective analog to digital converters generates a parallel multiple binary bit digital representation of the representation of the radio frequency signal, said parallel multiple binary bit digital representation and associated clock being routed by said non-blocking switch matrix to at least one digital radio frequency signal processor.

35. The method according to claim 25, further comprising the step of routing the regenerated output and associated regenerated clock together to maintain proper synchronization at a radio frequency signal processor.

36. The method according to claim 25, further comprising delaying data traveling over at least one data path with a delay compensation network to maintain proper synchronization among a plurality of data paths, each data path communicating a regenerated output and a respective regenerated clock.

37. The method according to claim 25, further comprising the step of simultaneously distributing a plurality of regenerated outputs with respective associated regenerated clocks from said non-blocking switch matrix, the plurality of associated regenerated clocks having respectively different clock frequencies.

38. The method according to claim 25, wherein said non-blocking switch matrix comprises a Banyan network.

39. The method according to claim 25, wherein said non-blocking switch matrix comprises a plurality of switch elements each controlled by at least one digital control line, to provide a digitally controllable input to output relationship, further comprising the step of applying a signal over a respective digital control line to said switch elements in parallel.

40. The method according to claim 25, wherein said non-blocking switch matrix comprises a plurality of switches each controlled by at least one digital control line, to provide a digitally controllable input to output relationship, further comprising the step of applying a first signal through respective digital control line to a first element, and generating a second signal with said first element which serves as an input to a second element, said first and second elements controlling respective switches.

41. The method according to claim 25, wherein the non-blocking switch matrix comprises a plurality of switches each controlled by at least one digital control line, to provide a digitally controllable input to output relationship between a respective analog signal coupler and a respective digital radio frequency signal processor, further comprising the step of applying a signal over a respective digital control line to a plurality of first elements, which generates a state of a respective digital control line for control of at least one second element, the first and second elements controlling respective switches.

42. The method according to claim 25, further comprising the step of communicating the radio frequency signals through a respective plurality of radio frequency couplers, said respective radio frequency couplers receiving the radio frequency signals through separate antennas, serving separate bands corresponding to each coupler.

43. The method according to claim 25, further comprising the steps of receiving a plurality of radio frequency signals through different antennas and communicating the received radio frequency signals through a respective plurality of radio frequency couplers, and selectively concurrently routing said digital representation of the analog representation and an associated clock through said non-blocking switch matrix, said plurality of digital radio frequency signal processors comprising a plurality of digital channelizing receivers.

44. The method according to claim 25, wherein at least one digital radio frequency signal processor comprises a channelizing receiver implementing at least one stage of digital down-conversion of the digital representation from a frequency of the radio frequency signal to a lower frequency, while substantially retaining information modulated in a channel of the radio frequency signal.

45. The method according to claim 25, wherein at least one digital radio frequency signal processor comprises a channelizing receiver implementing at least one stage of digital down-conversion of the digital representation from a frequency of the radio frequency signal to a lower frequency, while substantially retaining in-phase and quadrature-phase information modulated in a channel of the radio frequency signal.

46. A method for receiving signals, comprising:
generating digital data directly from a received radio frequency signal without frequency translation, based on a digital data clock signal defined independently of the received signal and having a sufficiently high clock rate to preserve information modulated in the received radio frequency signal, each having a respective output; and
receiving and selectively directing the outputs of a plurality of signal receivers and respective associated digital data clock signals with a non-blocking switch matrix, to a plurality of digital signal processors, each accepting the generated digital data at the high clock rate.

47. The method according to claim 46, wherein a quantity of digital signal processor is fewer than a quantity of signal receivers, and wherein the switch matrix provides a multicasting capability which permits an output of a respective signal receiver to be selectively provided to a plurality of digital signal processors.

48. The method according to claim 46, wherein a plurality of channels of the switch matrix have independently tunable analog delay.

\* \* \* \* \*